(12) United States Patent
Williams, III

(10) Patent No.: US 6,177,897 B1
(45) Date of Patent: Jan. 23, 2001

(54) HYBRID FIR/IIR ANALOG FILTER

(75) Inventor: Louis A. Williams, III, Plano, TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 09/243,642

(22) Filed: Feb. 3, 1999

Related U.S. Application Data

(60) Provisional application No. 60/073,584, filed on Feb. 3, 1998.

(51) Int. Cl.[7] .................................................. H03M 1/66
(52) U.S. Cl. ............................................ 341/150; 341/144
(58) Field of Search .................................. 341/150, 144, 341/172; 331/32

(56) References Cited

U.S. PATENT DOCUMENTS

| | | | | |
|---|---|---|---|---|
| 4,968,989 | * | 11/1990 | Olmstead et al. | 341/150 |
| 5,008,674 | * | 4/1991 | Da Franca et al. | 341/150 |
| 5,012,245 | * | 4/1991 | Scott et al. | 341/150 |
| 5,821,892 | * | 10/1998 | Smith | 341/150 |
| 6,011,501 | * | 1/2000 | Gong et al. | 341/150 |

OTHER PUBLICATIONS

Williams III, "An Audio DAC with 90dB Linearity using MOS to Metal–Metal Charge Transfer," 1998 International Solid–State Conference, Feb. 5, 1998.

Su et al., "A CMOS Oversampling D/A Converter with a Current–Mode Semidigital Reconstruction Filter," *IEEE Journal of Solid–State Circuits*, vol. 28, No. 12, Dec. 1993, pp. 1224–1233.

Baird et al., "Linearity Enhancement of Multibit$\Delta\Sigma$ A/D and D/A Converters Using Data Weighted Averaging," *IEEE Transactions on Circuits and Systems–II Analog and Digital Signal Processing*, vol. 42, No. 12, Dec. 1995, pp. 753–762.

Leung et al., "Multibit $\Sigma-\Delta$ A/D Converter Incorporating A Novel Class of Dynamic Element Matching Techniques, " *IEEE Transactions on Circuits and Systems–II: Analog and Digital Signal Processing*, vol. 39, No. 1, Jan. 1992, pp. 35–51.

McClellan et al., "A Computer Program for Designing Optimum FIR Linear Phase Digital Filters," *IEEE Transactions on Audio and Electroacoustics*, Dec. 1973, pp. 506–526.

Kwan et al., "A Stereo Multi–bit $\Sigma\Delta$ D/A with Asynchronous Master–Clock Interface," 1996 IEEE International Solid–State Circuits Conference, Feb. 1996, pp. 226–227.

Rothenberg et al., "A 20MSample/s Switched–Capacitor Finite–Impulse–Response Filter in $2\beta m$ CMOS," 1995 International Solid State Circuits Conference, Feb. 1995, pp. 210–214.

\* cited by examiner

*Primary Examiner*—Peguy Jean Pierre
(74) *Attorney, Agent, or Firm*—April M. Mosby; W. James Brady; Frederick J. Telecky, Jr.

(57) ABSTRACT

A hybrid FIR/IIR analog filter for filtering the coarsely quantized output of a sigma-delta modulator for digital-to-analog conversion. The functions of an FIR and IIR filter are combined into one circuit to gain the benefits of both, while requiring fewer taps than the present FIR approach, and requiring less area as an IIR filter.

13 Claims, 7 Drawing Sheets

HYBRID FIR/IIR ANALOG FILTER

This application claims priority under 35 USC § 119(e)(1) of provisional application No. 60/073,584 filed Feb. 3, 1998.

BACKGROUND AND SUMMARY OF THE INVENTION

The present invention relates to integrated circuit analog filter structures.

BACKGROUND
Mixed-Signal Processes

As signal processing systems move to higher levels of integration, it becomes necessary to integrate analog functions on chips in which most of the area is consumed by digital circuitry. When the analog circuitry occupies only a small percentage of the total chip area, economic considerations limit the addition of any process steps, such as fabrication of high-value capacitors, which are not required by the digital circuits.

Switched Capacitor Architectures

The need to have monolithic analog filters motivated circuit designers to investigate alternatives to conventional active-RC filters. The switched capacitor ("SC") filter provided a practical alternative. The original idea was to replace a resistor by an SC simulating the resistor. Thus the equivalent resistor could be implemented with a capacitor, and two switches operating with two clock phases. The basic building blocks involved in SC circuits are capacitors, switches, and op-amps, which can be used to make higher-order blocks such as voltage gain amplifiers, integrators, and second-order filters. These are discrete-time filters that operate like continuous-time filters, but through the use of switches, the capacitance values can be kept very small. As a result, SC filters are amenable to VLSI implementations.

The filters are characterized by difference equations in contrast to differential equations for continuous-time filters. The z-transform is the mathematical operator used to solve linear constant-coefficient difference equations which are used to help define sampled-data systems such as SC circuits.

Switched-capacitor filter architectures are discussed in greater detail in the following books: R. JACOB BAKER, CMOS—CIRCUIT DESIGN, LAYOUT, AND SIMULATION (IEEE Press, 1998); WAI-KAI CHEN, THE CIRCUITS AND FILTERS HANDBOOK (CRC Press and IEEE Press, 1995); S. NORSWORTHY, DELTA-SIGMA DATA CONVERTERS (IEEE PRESS, 1997); and R. GREGORIAN, ANALOG MOS INTEGRATED CIRCUITS FOR SIGNAL PROCESSING (John Wiley & Sons 1986); all of which are herein incorporated by reference.

FIR Filters

A semi-digital FIR filter can be implemented using a SC technique. A semi-digital reconstruction filter, in addition to converting digital samples into analog levels (digital function), converts discrete-time signals into continuous time (the analog reconstruction function). A function of the semi-digital reconstruction filter is to attenuate out-of-band quantization noise introduced by the preceding stages, and the spectral images that remain at multiples of the oversampling frequency. In a SC implementation, the analog signals are represented by charges stored on capacitors that can be summed using a SC summing amplifier. The individual capacitors in such an implementation need not have low voltage coefficients because the voltage across these capacitors is either 0 or Vref; thus they can be realized simply with MOS gate structure which are appropriately biased. However, the feedback capacitor in the summing amplifier must have a low voltage coefficient in order to ensure that the summing operation meets the linearity requirements of the overall converter.

Semi-digital reconstruction filters are also discussed in detail in; "A CMOS OVERSAMPLING D/A CONVERTER WITH A CURRENT-MODE SEMIDIGITAL RECONSTRUCTION FILTER, IEEE JOURNAL OF SOLID-STATE CIRCUITS, VOL. 28, No. 12, DECEMBER 1993," herein incorporated by reference.

Quantization Noise

The heart of a sigma-delta modulator or analog-to-digital converter ("ADC") is a quantizer enclosed in a feedback loop. A quantizer maps real numbers into a finite set of possible representative values. The quantization operation is inherently non-linear and hence produces quantization noise. Quantization noise is defined as the noise introduced during the process whereby an analog wave is divided into a finite number of subranges, each represented by an assigned (quantized) value. This noise component is present along with the desired signal and needs to minimized (filtered) in a digital-to-analog converter ("DAC"). The feedback loop shapes the noise such that it will lie outside the signal bandwidth where it can ultimately be filtered out.

Hybrid FIR/IIR Analog Filter

The present application discloses a means for filtering the coarsely quantized output of a sigma-delta modulator for digital-to-analog ("D/A") conversion. Sigma-delta modulators do not attenuate noise at all. Instead, they add quantization noise that is very large at high frequencies. However, since most of the noise is out-of-band (i.e. outside the signal bandwidth), it can be filtered, leaving only a small portion within the signal bandwidth. This invention reduces the out-of-band quantization noise produced by the sigma-delta modulation, producing a clean analog signal. A combination of finite-impulse-response ("FIR") and infinite-impulse-response ("IIR") techniques are used in the same analog filter to obtain the benefits of each while alleviating some of the problems of both. In the past, FIR and IIR filtering approaches have been used separately, but they have not been combined in this way.

An advantage of the disclosed method and structure is that it provides a less complex solution by requiring fewer taps than the present FIR approach. Another advantage is that it does not require as much area as an IIR filter, and therefore is less costly. For example, where prior art methods use more filter stages or higher capacitor ratios in the integrator, the disclosed technique requires smaller capacitor ratios (e.g. on the order of approximately 10/1) or fewer stages. Another advantage is that the disclosed embodiments are applicable to multilevel quantization architectures.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Single-Ended Hybrid FIR/IIR Filter

The hybrid (semi-digital) FIR/IIR filter is a switched-capacitor architecture that simultaneously implements a DAC, an FIR filter, and an IIR filter. The overall architecture is basically a multi-input switched-capacitor integrator.

Figure 1:
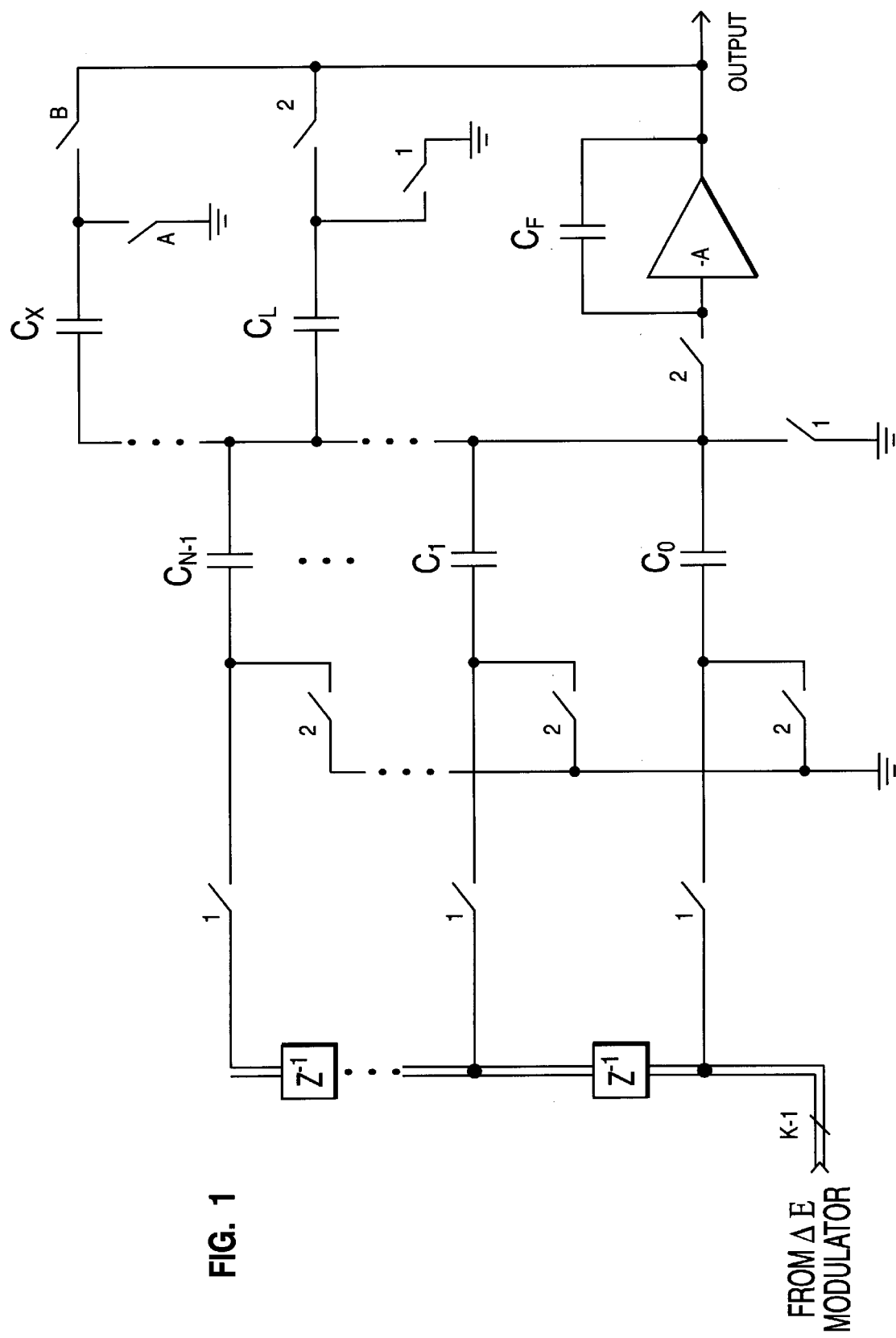
FIG. 1 shows a preferred embodiment of the present invention.

To clarify the operation of the hybrid FIR/IIR filter, a single-ended version without the embedded DAC is shown in FIG. 1. A two-phase non-overlapping clock is used (so switches 1 and 2 cannot be closed at the same time). The switches marked "1" are closed during the first phase, and the switches marked "2" are closed during the second phase.

During the first clock phase, the tap-delayed inputs are sampled onto the weighted capacitors $C_0$ through $C_{N-1}$. During the second clock phase, the sum of the charges on $C_0$ through $C_{N-1}$ is integrated onto $C_F$. The summation of these weighted capacitors forms the FIR component of the FIR/IIR hybrid. The IIR portion of the filter is created when the charge on $C_F$ is not cleared between samples; it integrates the sum of all previous inputs. One of the integrator inputs ($C_L$) is derived from the integrator output, and provides a controlled integrator leak. (The capacitor $C_L$ bleeds off a controlled fraction of this charge for each sample, and thus creates a "leaky" integrator.) Sample design parameters may be, for example, gain A=1, N=8, and $C_F/C_L$=16. The remaining N inputs are taken from delayed versions of the modulator output; the size of the capacitors $C_0$ through $C_{N-1}$, form the filter weights of an FIR filter.

The z-transform of the filter function for this combined filter architecture is $$H_1(z) = A_1 \frac{1-g_1}{1-g_1 z^{-1}} \sum_{n=0}^{N-1} h_n z^{-n}$$

where $$A_1 = \sum_{n=0}^{N-1} C_n / C_L,$$

$$g_1 = 1 - C_I/C_F, \text{ and}$$

$$h_n = C_n \bigg/ \sum_{n=0}^{N-1} C_n,$$

and $z^{-1}$ is a delay element. The FIR portion of the equation filter function equation comprises the later summation of the FIR taps ($h_n$). The IIR portion comprises the $(1-g_1)/(1-g_1 z^{-1})$ for the equation.

Optionally, an extra capacitor $C_X$ may be added in parallel to the IIR filter circuit comprising capacitors $C_L$ and $C_F$. Switches A and B are operated with non-overlapping clock phases. For example, A=1 (the first phase) and B=2 (the second clock phase), or vice versa. Furthermore, A and B may be operated by a clock phase other than 1 or 2 (which drive the other filter circuit switches).

Figure 2:
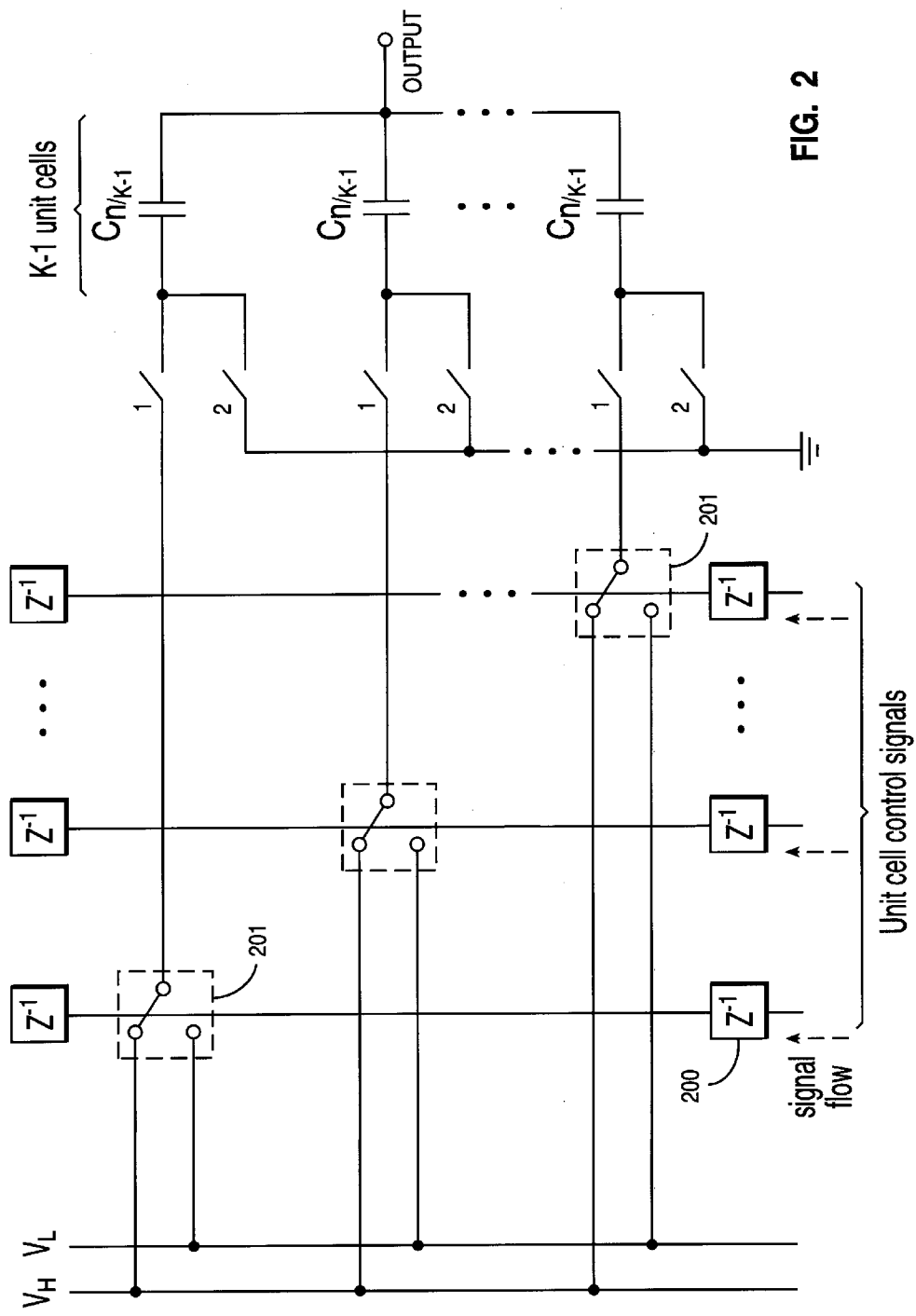
FIG. 2 shows an alternative embodiment utilizing a DAC with the FIR portion of the present invention.

The D/A conversion portion of the circuit is accomplished using a capacitor-array DAC (the unit cells are nominally equal). In a DAC with K levels, conversion of the K-level output of the modulator is accomplished by dividing each of the capacitors ($C_n$) into K−1 unit cells. One possible switching arrangement is illustrated in FIG. 2. If the digital bit is ZERO, $V_L$ is sampled during clock phase 1 and the charge on $C_n$ is dumped onto the lossy integrator during phase 2. Alternatively, if the digital bit is ONE, $V_H$ is sampled instead. Consequently, the output signal is a rough reconstruction of the original analog input signal with discrete voltage steps. Delay element 200 controls the switch 201 which selects between $V_H$ and $V_L$. Control of subsequent switches is similar.

To reduce the out-of-band noise as much as possible, $C_F$ should be as large as is practical. The FIR taps ($h_n$) are chosen using the Parks-McClellan algorithm (for discrete time signal processing) to minimize the step size at the output of this filter. The number of FIR filter taps (or filter length), N, is the minimum number of taps that achieves the desired out-of-band noise attenuation. For example, for N=6 and $C_F/C_L$=8, the out-of-band noise is attenuated by 40 dB (where $C_F/C_L$ is the integration-to-input capacitance ratio). (For a detailed discussion of the Parks-McClellan algorithm, see J. MCCLELLAN, A COMPUTER PROGRAM FOR DESIGNING OPTIMUM FIR LINEAR PHASE DIGITAL FILTERS, IEEE TRANSACTIONS ON AUDIO AND ELECTROACOUSTICS, VOL. AU-21, No. 6, (1973), which is herein incorporated by reference.)

Single-Ended Hybrid FIR/IIR Filter with Unit Cells

Figure 3:
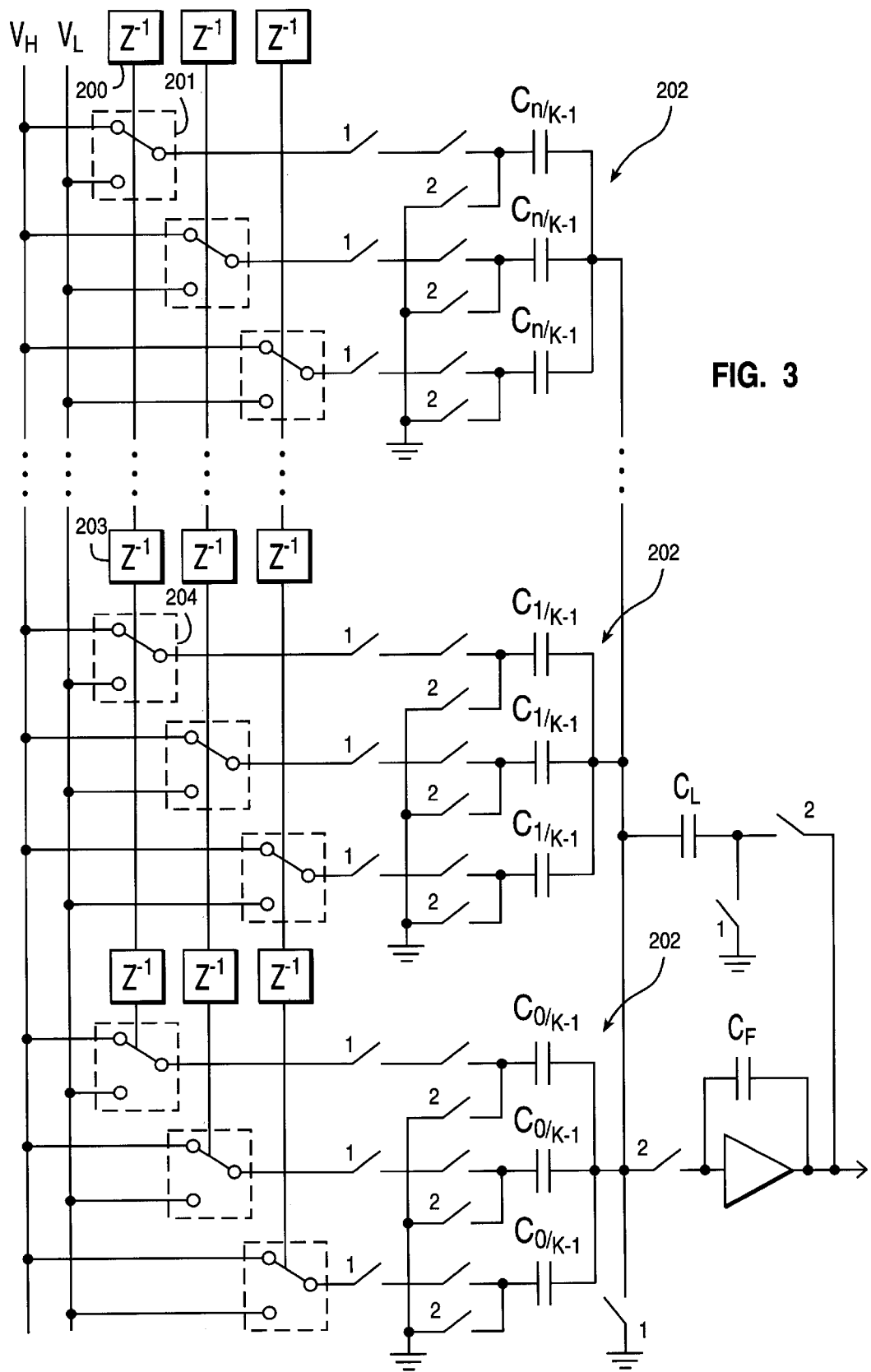
FIG. 3 shows the alternative embodiment of FIG. 2 implemented into the embodiment of FIG. 1.

FIG. 3 shows the alternative embodiment of FIG. 2 incorporated into the embodiment of FIG. 1. In a DAC of K bits, conversion of the K-level output of the modulator is accomplished by dividing each of the capacitors ($C_n$) into K−1 unit cells 202. Delay element 200 controls its respective switch 201 to select either a high or low voltage for storage in the capacitor of its unit cell. Similarly, delay element 203 controls its respective switch 204 to select either a high or low voltage for storage in the capacitor of its unit cell. The process is performed in the same manner for the remaining delay elements and switches where each capacitor is associated with only one delay element. The switches may be MOS devices.

The area and power consumption of the analog circuitry are realized due to the charge-sharing feature disclosed in Applicant's co-pending U.S. patent application Ser. No. 09/243,643, Linearized Charge Sharing Circuits with Non-Linear Capacitors (Attorney's docket number T-26149), which is hereby incorporated by reference.

Preferred Differential Embodiment

Figure 4:
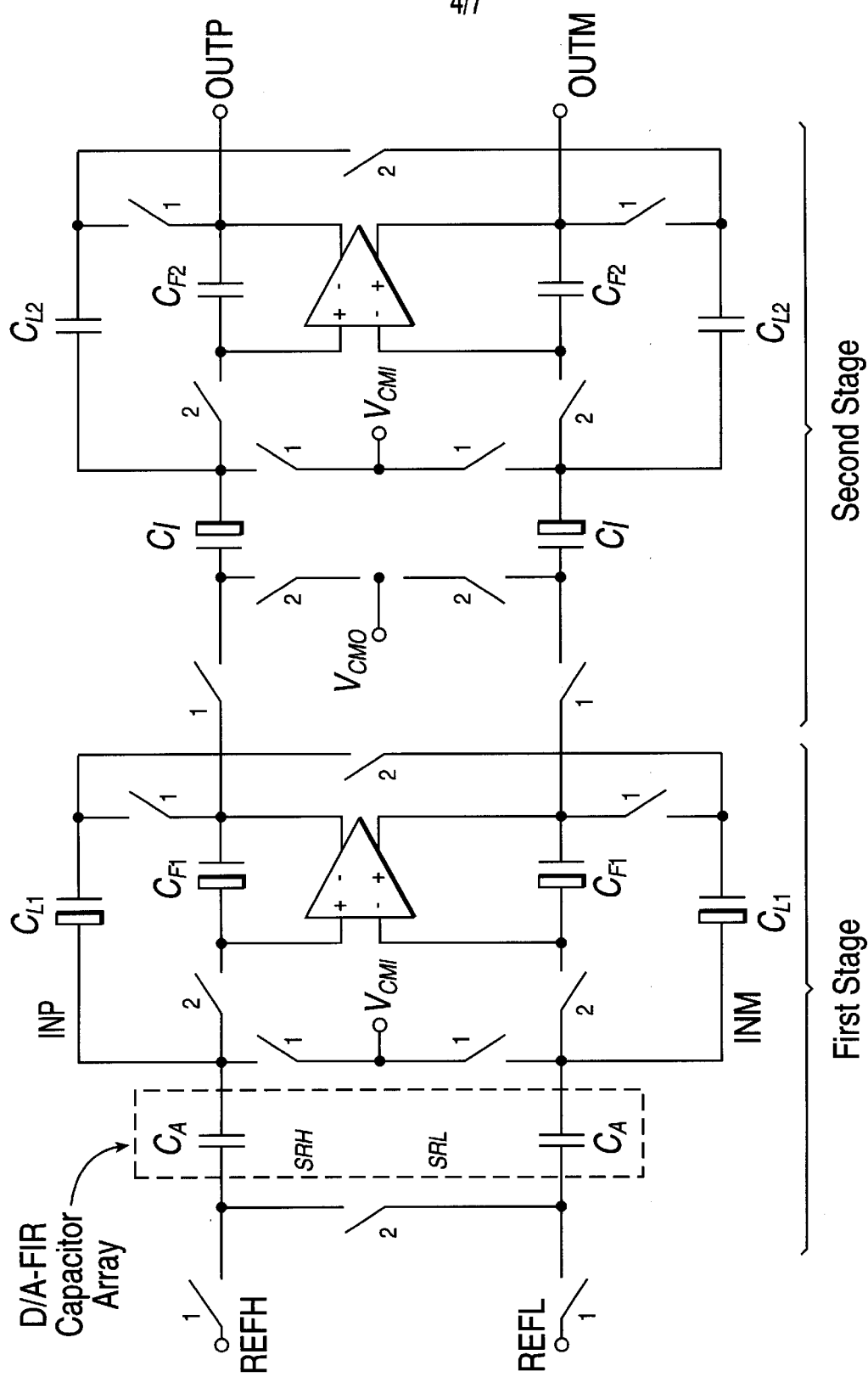
FIG. 4 shows a differential embodiment of the present invention.
Figure 5:
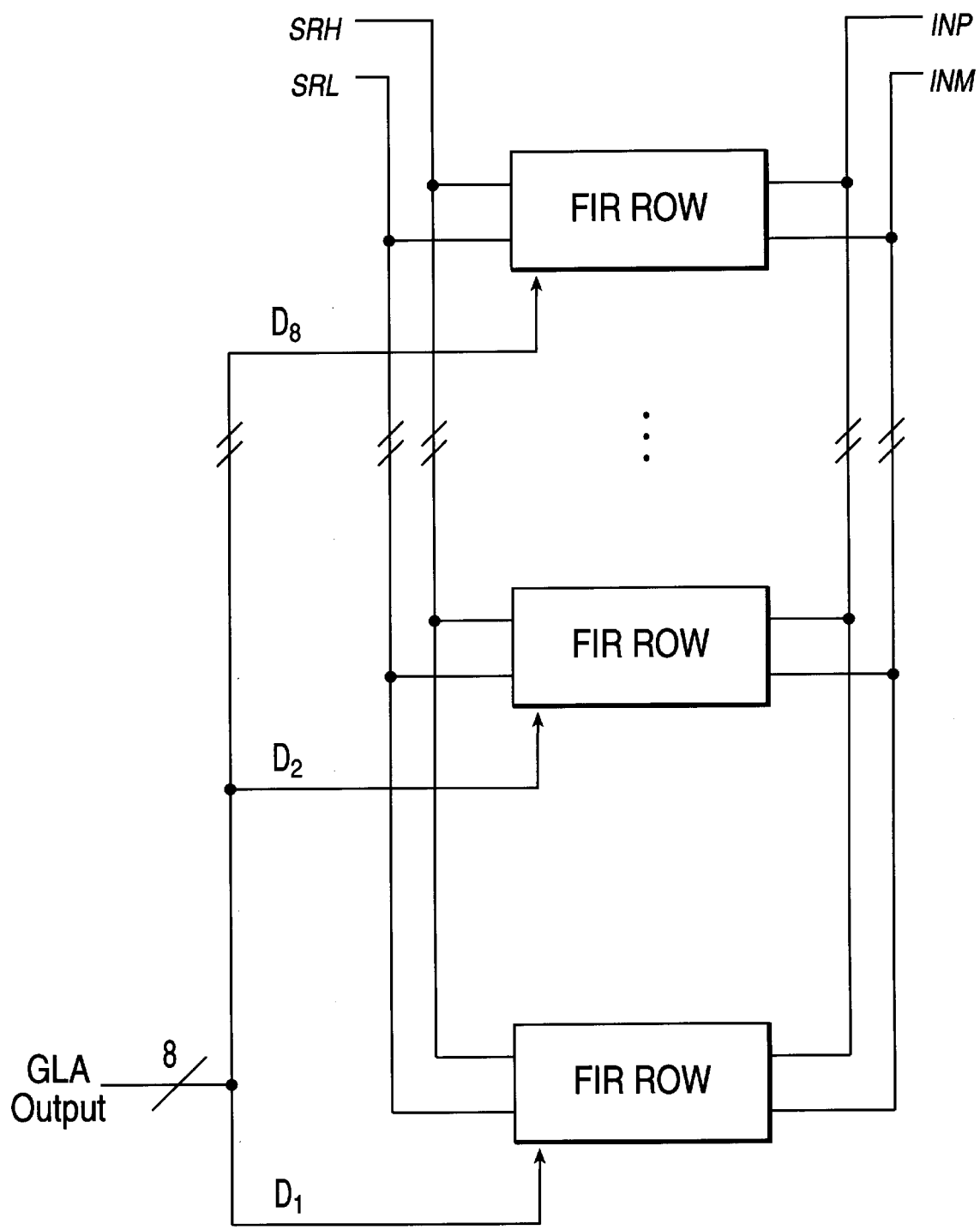
FIG. 5 shows a unit cell with a capacitor array of 8 cells compatible with the differential embodiment (it fits into the dashed area of FIG. 4).

FIG. 4 shows a differential embodiment of the present invention. As in the single-ended embodiment in FIG. 1, a two-phase non-overlapping clock is used. The IIR portion of the hybrid FIR/IIR filter in FIG. 4 is formed by capacitors $C_{F1}$ and $C_{L1}$. (In this design, $C_{F1}$ is sixteen times larger than the other capacitors, so constructing $C_{F1}$ using a high-density capacitor (as in Patent Application T-26149) results in a significant savings in area.) The FIR portion of the FIR/IIR hybrid and the nine-level coarse DAC for the circuit in FIG. 4 is embedded in the capacitor array $C_A$. This capacitor array is divided into eight nominally equal rows as shown in FIG. 5. Each row forms a unit cell for the coarse DAC. The matching errors of the multi-level coarse DAC that is embedded in the analog filter are modulated out of the signal band by a dynamic element matching technique called grouped level averaging ("GLA"). Applicant discloses the GLA algorithm in co-pending U.S. patent application Ser. No. 60/054,298, Group Level Averaging (Texas Instruments docket number T-24096P), which is hereby incorporated by reference.

Reference signal inputs, SRH and SRL, provide the high and low inputs, respectively for the array. The outputs of the array (INP and INM) are connected accordingly, as indicated, to the differential circuit of FIG. 4. The coarse DAC output is generated by summing zero to eight nominally equal unit cells. The sum of the charge on all of the rows is integrated on to $C_{F1}$. Any unit cell DAC could be built into this system.

Figure 6:
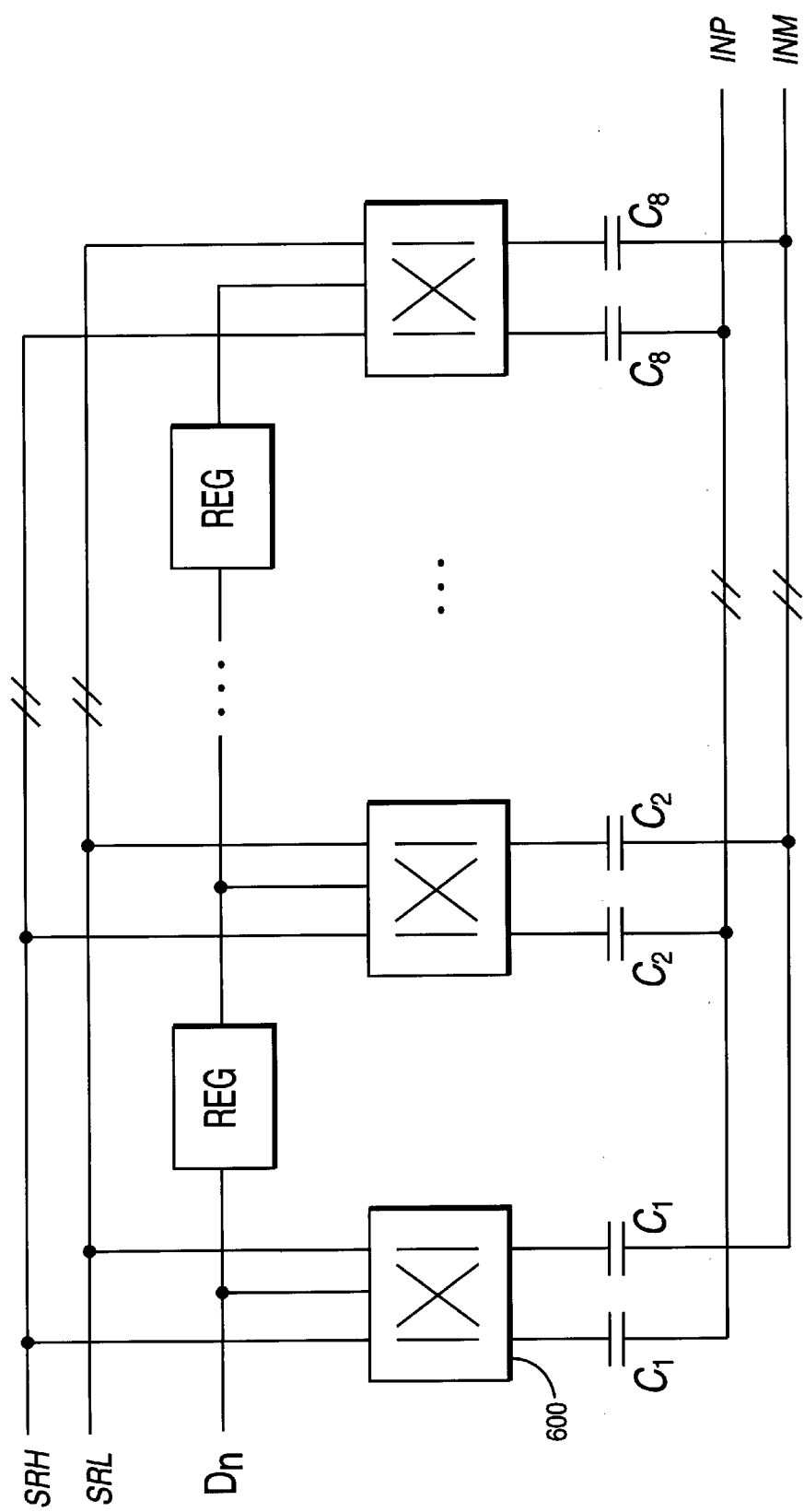
FIG. 6 shows a further division of the capacitor cells of FIG. 5.

Each FIR row in FIG. 5 is further subdivided into an eight cell weighted capacitor array as shown in FIG. 6. Relative cap sizes define FIR filter weights. The unit cell input $D_n$ for the row is shifted along a shift-register-type structure to create an analog FIR. The binary unit cell input 600 controls which polarity of the reference signals SRH (signal reference high, e.g. 3.3V) or SRL (signal reference low, e.g. ground) are sampled on the each tap of the filter. (The symbol shown in block 600 is a nonstandard symbol which indicates a double-throw switch controlled by a digital signal.) The outputs of the array (INP and INM) are connected accordingly, as indicated, to the differential circuit of FIG. 4. The operation of this analog FIR filter is similar to a previously reported semi-digital FIR filter, and like that circuit, the analog FIR has the property that mismatch between the capacitors does not effect the linearity of the system, only the filter attenuation.

The advantage of the hybrid FIR/IIR structure over either a pure FIR or a pure IIR structure is reduced complexity and silicon area. An FIR filter alone would have required several taps, while an IIR filter alone would have required a very large integration-to-input capacitance ratio. The hybrid structure attenuates the total out-of-band quantization noise to less than 60 dB below full scale with, for example, only 8 FIR taps and a 16:1 integration-to-input capacitance ratio.

The hybrid FIR/IIR analog filter and the embedded nine-level DAC may be fabricated in a 0.5-mm 3.3-V single-poly quad-metal CMOS process. The active analog circuit area is 1.8 mm$^2$, and the circuit consumes 47 mW from a 3.3-V supply. A sampling rate of 5.6 Mhz may be used, resulting in an oversampling ratio of 128. The metal-metal capacitors ($C_A$, $C_{L2}$, and $C_{F2}$) consume roughly 40% of the active area. If all of the PMOS capacitors were changed to metal-metal capacitors, the capacitor area would increase by a factor of six ($C_{F1}+C_{L1}+C_I=6(C_A+C_{F2}+C_{L2})$).]

Prior Art Semi-Digital Filter

Figure 7:
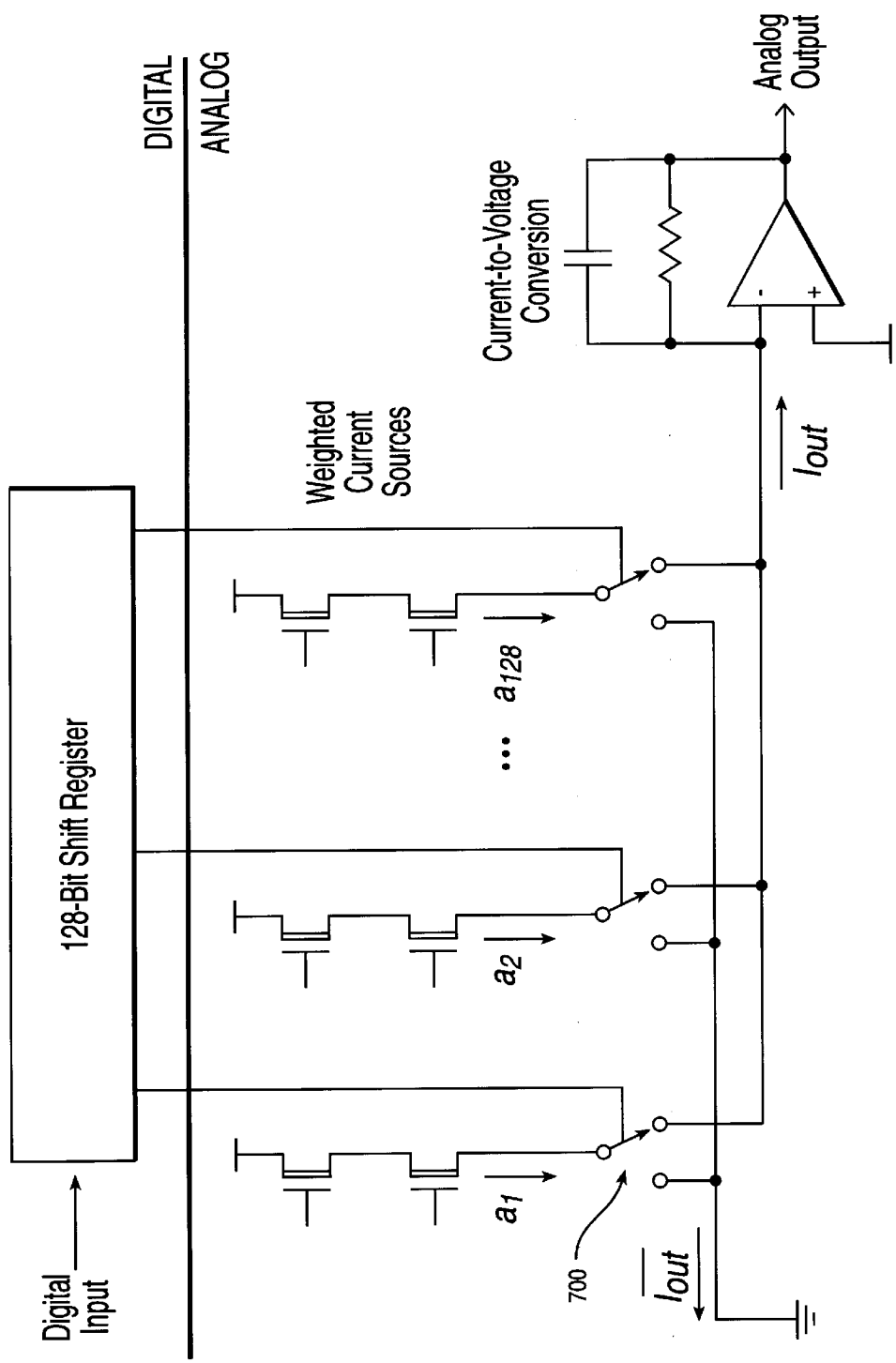
FIG. 7 shows a prior art current-mode implementation of a semi-igital reconstruction filter.

FIG. 7 shows a prior art current-mode implementation of a semi-digital reconstruction filter. Each of the weighted current sources represents an analog coefficient. The current source and its CMOS switch form a 1-bit D/A interface that generates an output current of $a_i$ when the respective switch 700 of each weighted current source is on.

According to a disclosed class of innovative embodiments, there is provided: a hybrid switched-capacitor integrated circuit filter, comprising: a digital-to-analog conversion circuit with multiple outputs; a finite-impulse-response switched capacitor filter stage with multiple inputs connected to said outputs; an infinite-impulse-response filter stage connected to follow said finite-impulse-response stage; whereby said out-of-band quantization noise is substantially reduced by the combination of said filter stages.

According to another disclosed class of innovative embodiments, there is provided: a hybrid switched-capacitor integrated circuit filter, comprising: a plurality of delay elements; a plurality of switched capacitor circuits connected in parallel, and connected to respective ones of said delay elements; a gain element having a switched input connected to a node common to all of said parallel capacitor circuits, and having an output terminal; an unswitched feedback capacitor connected in parallel to said gain element; and at least one switched leakage capacitor connected in parallel to said gain element; wherein said feedback capacitor is larger in area than said leakage capacitor; whereby said feedback capacitor and said gain element jointly provide an infinite-impulse-response function, and out-of-band quantization noise is substantially reduced.

According to another disclosed class of innovative embodiments, there is provided: a hybrid switched-capacitor integrated circuit filter, comprising: a high voltage line and a low voltage line; a plurality of delay elements controlling a plurality of respective switching devices, to selectively switch between said high and low voltage lines; a plurality of switched capacitor circuits connected in parallel, and comprising: a plurality of switched capacitor subcircuits connected to respective said switching devices; a gain element with a switched input connected to a node common to all of said parallel capacitor circuits, and to an output terminal; a feedback subcircuit connected in parallel to said gain element, which comprises at least one switched capacitor; whereby said feedback subcircuit and said gain element jointly provide an infinite-impulse-response function, and out-of-band quantization noise is substantially reduced.

According to another disclosed class of innovative embodiments, there is provided: a method for minimizing out-of-band quantization noise of a sigma-delta modulator circuit using a semi-digital filtering circuit, comprising the steps of: (a.) providing a plurality of delay elements; (b.) switching a plurality of capacitor circuits to respective ones of said delay elements; wherein said capacitor circuits are connected in parallel; integrating the sum of the voltages of said capacitors onto a feedback capacitor connected in parallel with a gain element; and controlling the DC gain of said gain element with a leakage capacitor connected in parallel with said gain element; wherein said feedback capacitor is larger in area than said leakage capacitor.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Similarly, it will be readily recognized that the described process steps can also be embedded into hybrid process flows, such as BiCMOS or smart-power processes.

It will also be readily recognizable that the described techniques may be applied to a differential implementation.

It will also be readily recognizable that the number of capacitors per unit cell may be more or less than the number depicted in FIG. 3.

What is claimed is:

1. A hybrid switched-capacitor integrated circuit filter, comprising:

a plurality of delay elements;

a plurality of switched capacitor circuits connected in parallel, and connected to respective ones of said delay elements;

a gain element having a switched input connected to a node common to all of said parallel capacitor circuits, and having an output terminal;

an unswitched feedback capacitor connected in parallel to said gain element; and at least one switched leakage capacitor connected in parallel to said gain element; wherein said feedback capacitor is larger in area than said leakage capacitor;

whereby said feedback capacitor and said gain element jointly provide an infinite-impulse-response function, and out-of-band quantization noise is substantially reduced.

2. The integrated circuit of claim 1, wherein a first clock phase activates sampling of charges of said plurality of delay elements onto said plurality of respective ones of said switched capacitors, and a second clock phase activates integration of said charges of said plurality of switched capacitors onto said feedback capacitor.

3. The integrated circuit of claim 1, wherein said filter is switched with a two-phase clock.

4. The integrated circuit of claim 1, wherein said feedback capacitor has more than 10 times the area of said leakage capacitor.

5. A hybrid switched-capacitor integrated circuit filter, comprising:

a high voltage line and a low voltage line;

a plurality of delay elements controlling a plurality of respective switching devices, to selectively switch between said high and low voltage lines;

a plurality of switched capacitor circuits connected in parallel, and comprising:
a plurality of switched capacitor subcircuits connected to respective said switching devices;

a gain element with a switched input connected to a node common to all of said parallel capacitor circuits, and to an output terminal;

a feedback subcircuit connected in parallel to said gain element, which comprises at least one switched capacitor;

whereby said feedback subcircuit and said gain element jointly provide an infinite-impulse-response function, and out-of-band quantization noise is substantially reduced.

6. The integrated circuit of claim 5, wherein a first clock phase activates sampling of charges of said plurality of delay elements onto said plurality of respective ones of said switched capacitors, and a second clock phase activates integration of said charges of said plurality of switched capacitors onto said feedback capacitor.

7. The integrated circuit of claim 5, wherein said filter is switched with a two-phase clock.

8. The integrated circuit of claim 5, wherein said high voltage is approximately 3.3 volts, and said low voltage is approximately ground.

9. A method for minimizing out-of-band quantization noise of a sigma-delta modulator circuit using a semi-digital filtering circuit, comprising the steps of:

(a.) providing a plurality of delay elements;

(b.) switching a plurality of capacitor circuits to respective ones of said delay elements; wherein said capacitor circuits are connected in parallel;

(c.) integrating the sum of the voltages of said capacitors onto a feedback capacitor connected in parallel with a gain element; and (d.) controlling the DC gain of said gain element with a leakage capacitor connected in parallel with said gain element; wherein said feedback capacitor is larger in area than said leakage capacitor.

10. The method of claim 9, wherein a first clock phase activates sampling of charges of said plurality of delay elements onto said plurality of respective ones of said switched capacitors, and a second clock phase activates integration of said charges of said plurality of switched capacitors onto said feedback capacitor.

11. The method of claim 9, wherein said filter is switched with a two-phase clock.

12. The method of claim 9, wherein said feedback capacitor is more than ten times larger in area than said leakage capacitor.

13. The method of claim 9, wherein said high voltage is approximately 3.3 volts, and said low voltage is approximately ground.

* * * * *